United States Patent
Otsubo et al.

(10) Patent No.: US 10,084,428 B2
(45) Date of Patent: Sep. 25, 2018

(54) ELASTIC WAVE DEVICE AND METHOD FOR MANUFACTURING THE SAME

(71) Applicant: Murata Manufacturing Co., Ltd., Nagaokakyo-shi, Kyoto-fu (JP)

(72) Inventors: Ryo Otsubo, Nagaokakyo (JP); Koji Yamamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 373 days.

(21) Appl. No.: 14/932,182

(22) Filed: Nov. 4, 2015

(65) Prior Publication Data

US 2016/0056789 A1 Feb. 25, 2016

Related U.S. Application Data

(63) Continuation of application No. PCT/JP2014/062330, filed on May 8, 2014.

(30) Foreign Application Priority Data

May 14, 2013 (JP) .................. 2013-102420

(51) Int. Cl.
| | |
|---|---|
| *H03H 9/02* | (2006.01) |
| *H03H 9/145* | (2006.01) |
| *H03H 3/02* | (2006.01) |
| *H03H 3/10* | (2006.01) |
| *H03H 9/10* | (2006.01) |

(52) U.S. Cl.
CPC .......... *H03H 9/02992* (2013.01); *H03H 3/02* (2013.01); *H03H 3/10* (2013.01); *H03H 9/02574* (2013.01); *H03H 9/14541* (2013.01); *H03H 9/1071* (2013.01)

(58) Field of Classification Search
CPC .......... H03H 9/02535; H03H 9/02992; H03H 9/02574; H03H 9/14541
USPC ...... 310/313 R, 313 A, 313 B, 313 C, 313 D
See application file for complete search history.

(56) References Cited

U.S. PATENT DOCUMENTS

| | | | |
|---|---|---|---|
| 2003/0155844 A1 | 8/2003 | Anasako | |
| 2010/0117483 A1 | 5/2010 | Tanaka et al. | |
| 2013/0207514 A1* | 8/2013 | Sakaguchi | ........... H03H 9/0222 310/313 B |

FOREIGN PATENT DOCUMENTS

| | | |
|---|---|---|
| JP | 2002-353767 A | 12/2002 |
| JP | 2003-243961 A | 8/2003 |
| WO | 2009/016906 A1 | 2/2009 |
| WO | 2012/036178 A1 | 3/2012 |

(Continued)

OTHER PUBLICATIONS

Official Communication issued in International Patent Application No. PCT/JP2014/062330, dated Jul. 22, 2014.

*Primary Examiner* — Derek Rosenau
(74) *Attorney, Agent, or Firm* — Keating & Bennett, LLP (57) ABSTRACT

An IDT electrode of an elastic wave device includes a first electrode film made of Al or mainly containing Al, a second electrode film with a density larger than that of the first electrode film, an anti-diffusion film which is located between the first electrode film and the second electrode film and which significantly reduces or prevents interdiffusion between the first electrode film and the second electrode film, and a first Ti film located between the first electrode film and the anti-diffusion film, to diffuse a diffusion material into the first electrode film.

19 Claims, 5 Drawing Sheets

(56) References Cited

FOREIGN PATENT DOCUMENTS

WO 2012/169452 A1 12/2012

* cited by examiner

ELASTIC WAVE DEVICE AND METHOD FOR MANUFACTURING THE SAME

BACKGROUND OF THE INVENTION

1. Field of the Invention

The present invention relates to an elastic wave device and a method for manufacturing the same. The present invention particularly relates to a multilayer structure of an IDT (inter-digital transducer) electrode of the elastic wave device.

2. Description of the Related Art

Elastic wave devices are actually used as, for example, band-pass filters mounted in RF circuits for communication devices such as mobile phones. The elastic wave devices are required to have predetermined frequency characteristics so as to function as band-pass filters and are also required to have electric power handling capability so as to resist electricity applied to the RF circuits.

An elastic wave device includes a piezoelectric substrate and IDT electrodes located on the piezoelectric substrate. Each IDT electrode includes electrode fingers and a bus bar. The IDT electrode is formed by stacking, for example, a first electrode film which has low electrical resistance and which is made of Al (aluminium) and a second electrode film with relatively high density. When large electricity is applied to the elastic wave device, the IDT electrode generates heat and therefore interdiffusion occurs between the first and second electrode films. The interdiffusion therebetween increases the electrical resistance of the IDT electrode to deteriorate frequency characteristics of the elastic wave device.

Figure 7:
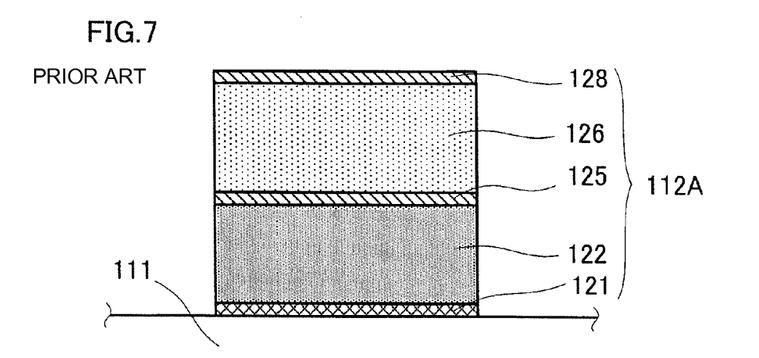
FIG. 7 is a sectional view of an electrode finger 112A of an IDT electrode described in International Publication No. WO 2009/016906.

International Publication No. WO 2009/016906 discloses an elastic wave device including an electrode finger 112A as shown in FIG. 7. The electrode finger 112A includes an adhesion film 121, a second electrode film (Pt film) 122, a Ti film 125, a first electrode film (Al alloy film) 126, and a Ti film 128 stacked on a piezoelectric substrate 111 in that order. In the elastic wave device, since the Ti film 125 is located between the first electrode film 126 and the second electrode film 122, the interdiffusion between the first electrode film 126 and the second electrode film 122 can be suppressed to a certain extent. However, in the case where the elastic wave device is used over a long period of time, interdiffusion gradually proceeds to deteriorate frequency characteristics of the elastic wave device. That is, it is difficult to allow the elastic wave device to function over a long period of time using the Ti film 125 only.

Figure 8:
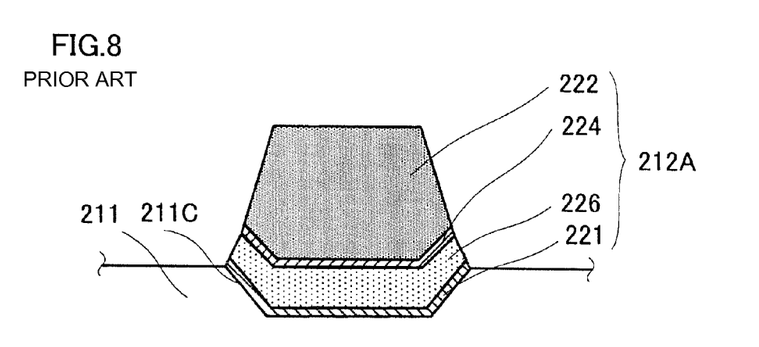
FIG. 8 is a sectional view of an electrode finger 212A of an IDT electrode described in International Publication No. WO 2012/036178.

International Publication No. WO 2012/036178 discloses an elastic wave device including an electrode finger 212A as shown in FIG. 8. The electrode finger 212A includes an adhesion film 221, a first electrode film (Al alloy film) 226, a Ti oxide film 224, and a second electrode film (Pt film) 222 stacked on a recessed portion 211C of a piezoelectric substrate 211 in that order. In the elastic wave device, since the Ti oxide film 224 is located between the first electrode film 226 and the second electrode film 222, the interdiffusion between the first electrode film 226 and the second electrode film 222 can be considerably suppressed. Therefore, frequency characteristics of the elastic wave device are unlikely to be deteriorated. However, when large electricity is applied to the elastic wave device, stress migration occurs in the first electrode film 226, which mainly contains Al, to electrically deteriorate the first electrode film 226, leading to the increase in electrical resistance of the first electrode film 226. Therefore, the insertion loss of electricity applied to the elastic wave device is increased, leading to a problem that power durability life is reduced. That is, it is difficult to allow the elastic wave device to function over a long period of time using the Ti oxide film 224 only.

SUMMARY OF THE INVENTION

Preferred embodiments of the present invention significantly reduce or prevent interdiffusion between a first electrode film and a second electrode film that are components of an electrode finger of an IDT electrode and provide an elastic wave device having a long power durability life as a result of significantly reducing or preventing deterioration of the first electrode film, and a method for manufacturing the elastic device.

An elastic wave device according to a first aspect of various preferred embodiments of the present invention includes a piezoelectric substrate and an IDT electrode which is located on the piezoelectric substrate and which includes electrode fingers. The IDT electrode is a multilayer electrode including a first electrode film made of Al or an alloy mainly including Al; a second electrode film with a density larger than that of the first electrode film; an anti-diffusion film which is located between the first electrode film and the second electrode film and which prevents the interdiffusion between the first electrode film and the second electrode film; and a diffusion film, located between the first electrode film and the anti-diffusion film, to diffuse a diffusion material into the first electrode film.

It is preferred that the anti-diffusion film diffuses a diffusion material into the first electrode film. It is also preferred that the anti-diffusion film is made of an oxide or a nitride of Ti and a first Ti film. The diffusion material is made of Ti.

Furthermore, it is preferred that the IDT electrode further includes an unoxidized or unnitrided second Ti film located between the anti-diffusion film and the second electrode film and the thickness of the first Ti film is larger than the thickness of the second Ti film.

Furthermore, it is preferred that the anti-diffusion film is a region in which a single-layer Ti film made of Ti only is located on the second electrode film and a surface of the single-layer Ti film is then oxidized or nitrided and the second Ti film is an unoxidized or unnitrided region of the single-layer Ti film.

It is preferred that the anti-diffusion film diffuses a diffusion material into the first electrode film. It is also preferred that the anti-diffusion film is made of an oxide or a nitride of Cr and a first Cr film. The diffusion material is made of Cr. It is preferred that the IDT electrode includes an unoxidized or unnitrided second Cr film located between the anti-diffusion film and the second electrode film and the thickness of the first Cr film is larger than the thickness of the second Cr film.

Furthermore, it is preferred that the anti-diffusion film is a region in which a single-layer Cr film made of Cr only is located on the second electrode film and a surface of the single-layer Cr film is then oxidized or nitrided and the second Cr film is an unoxidized or unnitrided region of the single-layer Cr film.

A method for manufacturing an elastic wave device according to another aspect of various preferred embodiments of the present invention includes a step of directly or indirectly attaching a second electrode film to a piezoelectric substrate, a step of providing a single-layer Ti film on the second electrode film, a step of forming an anti-diffusion film and a second Ti film from the single-layer Ti film by oxidizing or nitriding a surface of the single-layer Ti film, a step of providing a first Ti film on the anti-diffusion film, and a step of providing a first electrode film on the first Ti film.

A method for manufacturing an elastic wave device according to a further aspect of various preferred embodiments of the present invention includes a step of directly or indirectly attaching a second electrode film to a piezoelectric substrate, a step of providing a single-layer Cr film on the second electrode film, a step of forming an anti-diffusion film and a second Cr film from the single-layer Cr film by oxidizing or nitriding a surface of the single-layer Cr film, a step of providing a first Cr film on the anti-diffusion film, and a step of providing a first electrode film on the first Cr film.

According to an aspect of various preferred embodiments of the present invention, the IDT electrode of the elastic wave device includes the anti-diffusion film, which is located between the first electrode film and the second electrode film, and the diffusion film, which is located between the first electrode film and the anti-diffusion film. This significantly reduces or prevents interdiffusion between the first electrode film and the second electrode film and diffuses the diffusion material into the first electrode film to significantly reduce or prevent the electrical deterioration of the first electrode film. As a result, the power durability life of the elastic wave device is increased.

According to another aspect of various preferred embodiments of the present invention, since the anti-diffusion film preferably is formed by oxidizing or nitriding the surface of the single-layer Ti film, the surface of the anti-diffusion film is uniform and the adhesion of the second electrode film, which is formed on the surface thereof, is increased.

According to a further aspect of various preferred embodiments of the present invention, Ti in the preceding aspect of various preferred embodiments of the present invention is replaced with Cr and obtains an effect similar to that of the preceding aspect.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

Figure 1:
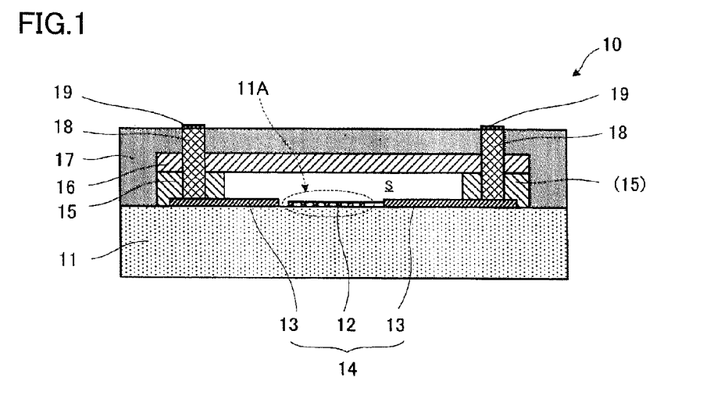
FIG. 1 is a schematic sectional view of an elastic wave device 10 according to a first preferred embodiment of the present invention.

An elastic wave device 10 according to a first preferred embodiment of the present invention is described with reference to FIG. 1 using an example in which a piezoelectric element 11A is packaged. Examples of the piezoelectric element 11A include SAW (surface acoustic wave) filters, SAW resonators, and boundary wave filters. In actual fact, the elastic wave device 10 is provided with a plurality of piezoelectric elements 11A. The elastic wave device 10 is not limited to a packaged one as shown in FIG. 1 and may have another structure. FIG. 1 shows an example.

The elastic wave device 10 includes a piezoelectric substrate 11, piezoelectric element electrodes 14, a support section 15, an insulating member 16, a protective member 17, and via-conductors 18.

The piezoelectric substrate 11 is a base of the elastic wave device 10. Examples of a material for forming the piezoelectric substrate 11 include lithium niobate, potassium niobate, lithium tantalate, quartz, langasite, ZnO, PZT, and lithium tetraborate.

Figure 2:
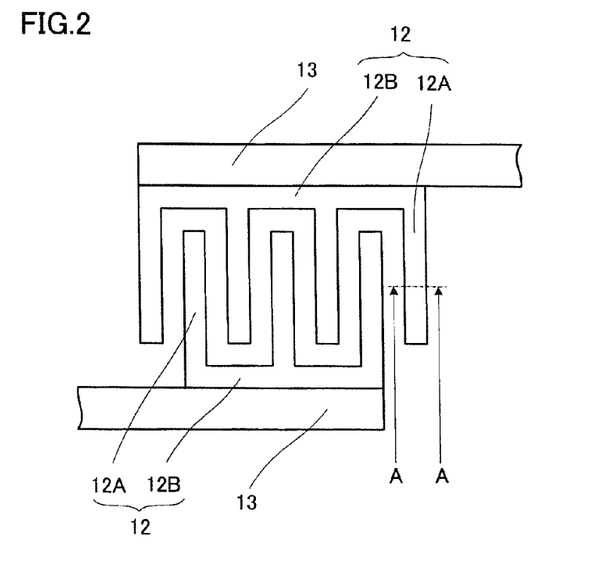
FIG. 2 is a plan view of an IDT electrode 12 of the elastic wave device 10 shown in FIG. 1.

Each piezoelectric element electrode 14 includes IDT (inter-digital transducer) electrodes 12, extended electrodes 13, and a reflector (not shown) and is located on the piezoelectric substrate 11. As shown in FIG. 2, each IDT electrode 12 includes electrode fingers 12A and a bas bar 12B. In the first preferred embodiment, the IDT electrode 12 preferably has a multilayer structure. The multilayer structure is described below.

The support section 15 has a frame shape and is located on a principal surface of the piezoelectric substrate 11 so as to surround the piezoelectric elements 11A. The thickness of the support section 15 is larger than the thickness of the piezoelectric element electrode 14.

The insulating member 16 preferably is a film, is spaced from the piezoelectric elements 11A, and is located above the piezoelectric substrate 11 with the support section 15 therebetween so as to cover the piezoelectric elements 11A. In particular, the insulating member 16 is located in parallel or substantially parallel to a principal surface of the piezoelectric substrate 11 in such a state that the insulating member 16 is in contact with the support section 15. This allows the piezoelectric substrate 11, the support section 15, and the insulating member 16 to define a closed space S in the elastic wave device 10, thus enabling an elastic wave to be excited. Thus, the elastic wave propagates along a principal surface of the piezoelectric substrate 11.

The protective member 17 is located over the insulating member 16 and the piezoelectric substrate 11. The protective member 17 preferably is formed in such a manner that the insulating member 16 and the piezoelectric substrate 11 are sealed with resin at high temperature (e.g., about 300° C.)

Examples of a material for forming the support section 15, the insulating member 16, and the protective member 17 include polyimide resins, epoxy resins, acrylic resins, silicone resins, and benzocyclobutene resins.

The via-conductors 18 extend through the support section 15, the insulating member 16, and the protective member 17 in a thickness direction. One end of each via-conductor 18 is electrically connected to a corresponding one of the IDT electrodes 12 through a corresponding one of the extended electrodes 13. The other end of the via-conductor 18 is exposed on an outside surface of the protective member 17 and is connected to an external terminal 19.

The insulating member 16 and the support section 15 may be integral with each other. In order to stabilize temperature characteristics of the elastic wave device 10, a $SiO_2$ film may be formed over the IDT electrodes 12 by sputtering or the like.

Figure 3:
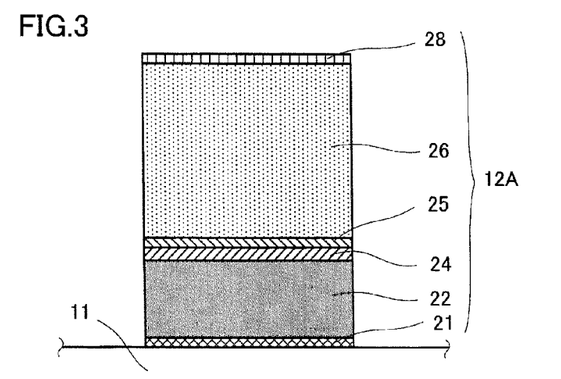
FIG. 3 is an A-A sectional view of an electrode finger 12A of the IDT electrode 12 shown in FIG. 2.

FIG. 3 is an A-A sectional view of one of the electrode fingers 12A of the IDT electrodes 12. The electrode fingers 12A preferably have a width of, for example, about 200 nm to about 1,000 nm and a thickness of, for example, about 200 nm to about 400 nm.

Each IDT electrode 12 is a multilayer electrode including a first electrode film 26, a first Ti film (diffusion film) 25, an anti-diffusion film 24, and a second electrode film 22. The first electrode film 26, the first Ti film 25, the anti-diffusion film 24, and the second electrode film 22 preferably are formed on the piezoelectric substrate 11 by a lift-off process. In particular, these films are preferably formed such that a mask is formed on the piezoelectric substrate 11, these films are deposited on the piezoelectric substrate 11 by a thin film formation process in turn, and the mask is then removed.

The first electrode film 26 securely transmits electricity into the IDT electrode 12. A material for forming the first electrode film 26 is Al (aluminium), which has low resistance, or an Al alloy mainly containing Al. The Al alloy used may be an Al—Cu alloy containing about 10% by weight Cu. The thickness of the first electrode film 26 is larger than the thickness of the first Ti film 25, the anti-diffusion film 24, or the second electrode film 22 and preferably is, for example, about 100 nm to about 300 nm.

The second electrode film 22 confines the energy of an elastic wave in the IDT electrode 12. A material for forming the second electrode film 22 is a metal or alloy with a density larger than that of the first electrode film 26 and is, for example, a metal selected from the group consisting of Pt, Au, Cu, Ag, and Pd or an alloy containing one or more selected from the group consisting of Pt, Au, Cu, Ag, and Pd. The thickness of the second electrode film 22 is larger than the thickness of the first Ti film 25 or the anti-diffusion film 24 and preferably is, for example, about 30 nm to about 90 nm.

In order to effectively exhibit a function of confining the energy of an elastic wave, the second electrode film 22 is preferably positioned close to the piezoelectric substrate 11. Thus, in the first preferred embodiment, the second electrode film 22 is located closer to the piezoelectric substrate 11 than the position of the first electrode film 26.

The anti-diffusion film 24 is one, located between the first electrode film 26 and the second electrode film 22, to significantly reduce or prevent the interdiffusion of an element contained in the first electrode film 26 and an element contained in the second electrode film 22. The anti-diffusion film 24 is located between the first electrode film 26 and the second electrode film 22. A material for forming the anti-diffusion film 24 is an oxide or nitride of Ti and includes Ti oxynitride. The oxide or nitride of Ti has a higher capability (barrier property) of blocking the migration of a substance as compared to a single-layer Ti film made of Ti only. Therefore, even if electricity is applied to the elastic wave device 10 and the IDT electrodes 12 generates heat, the interdiffusion between the first electrode film 26 and the second electrode film 22 is sufficiently reduced or prevented. The anti-diffusion film 24 is superior in heat resistance to such a single-layer Ti film. Therefore, even if the elastic wave device 10 is manufactured under high-temperature conditions such as sputtering and resin sealing, barrier properties of the anti-diffusion film 24 are maintained.

The anti-diffusion film 24 preferably is formed in such a manner that the oxide or nitride of Ti is directly deposited on the second electrode film 22 by sputtering or a single-layer Ti film made of Ti only is formed on the second electrode film 22 and the whole of the single-layer Ti film is then oxidized or nitrided. The thickness of the anti-diffusion film 24 is, for example, about 10 nm or less. When the thickness of the anti-diffusion film 24 is about 0.5 nm or more, interdiffusion is able to be significantly reduced or prevented.

The first Ti film (diffusion film) 25 actively diffuses Ti (a diffusion material) into the first electrode film 26. The first Ti film 25 is located between the first electrode film 26 and the anti-diffusion film 24 and is in contact with the first electrode film 26. The thickness of the first Ti film 25 is, for example, about 5 nm to about 20 nm. A material for forming the first Ti film 25 is preferably Ti only. A diffusion material diffused into the first electrode film 26 is not limited to Ti and may be, for example, Cr or Ni.

The presence of the first Ti film (diffusion film) 25 allows Ti to diffuse into the first electrode film 26 when electricity is applied to the IDT electrode 12. This allows the electrical deterioration of the first electrode film 26, which is made of Al or the Al alloy to be significantly reduced or prevented. As a result, the insertion loss of electricity applied to the elastic wave device 10 is significantly reduced or prevented and the power durability life thereof is increased.

Figure 4A:
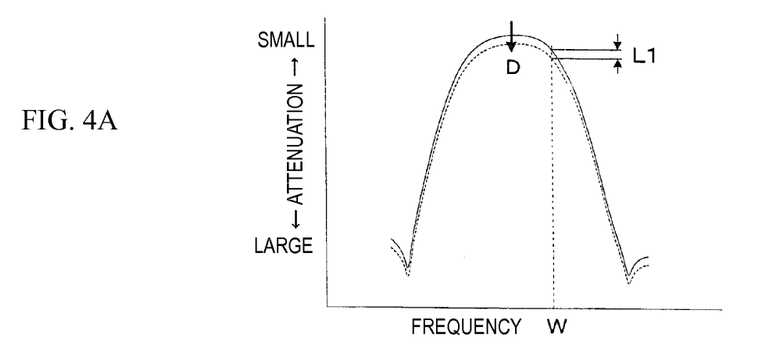
FIGS. 4A and 4B are graphs each showing the temporal change of a frequency characteristic of an elastic wave device.
Figure 4B:
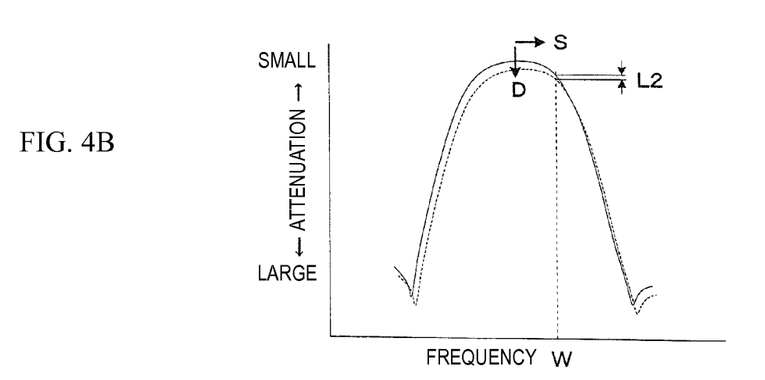

The role of the first Ti film 25 is described with reference to FIGS. 4A and 4B. FIG. 4A is a conceptual graph showing the temporal change of a frequency characteristic of an elastic wave device according to a comparative example. FIG. 4B is a conceptual graph showing the temporal change of a frequency characteristic of the elastic wave device 10 according to the first preferred embodiment. The elastic wave device according to the comparative example has an IDT electrode structure lacking the first Ti film 25 in comparison to the elastic wave device 10 according to the first preferred embodiment.

As shown in FIG. 4A, in the elastic wave device according to the comparative example, when electricity is applied to IDT electrodes 12, stress migration occurs in first electrode films 26 made of Al or an Al alloy to electrically deteriorate the first electrode film 26. This shifts the frequency characteristic of the elastic wave device in a direction in which attenuation increases (the direction of Arrow D). The insertion loss of electricity applied to the elastic wave device is judged on the basis of a difference in attenuation at a frequency W at which electricity consumption is highest. In the elastic wave device according to the comparative example, a difference L1 in attenuation is equal to the distance that the frequency characteristic thereof shifts in the direction of Arrow D.

As shown in FIG. 4B, in the elastic wave device 10 according to the first preferred embodiment, applying electricity to the IDT electrodes 12 shifts the frequency characteristic of the elastic wave device 10 in the direction of Arrow D. However, the application of electricity diffuses Ti from the first Ti film 25 to the first electrode film 26. The diffusion of Ti shifts the frequency characteristic of the elastic wave device 10 in a direction in which the frequency is high (the direction of Arrow S). Therefore, in the elastic wave device 10, a difference L2 in attenuation at a frequency W is less than the difference L1 in attenuation of the comparative example. Thus, the electricity consumption of the elastic wave device 10 is significantly reduced or prevented.

The first preferred embodiment features the positional relationship between the first electrode film 26, the first Ti film 25, the anti-diffusion film 24, and the second electrode film 22. That is, in the first preferred embodiment, the anti-diffusion film 24 is located between the first electrode film 26 and the second electrode film 22 and the first Ti film 25 is located between the first electrode film 26 and the anti-diffusion film 24. This significantly reduces or prevents the interdiffusion between the first electrode film 26 and the second electrode film 22 and also significantly reduces or prevents the electrical deterioration of the first electrode film 26. As a result, the electricity consumption of the elastic wave device 10 is small and the power durability life thereof is increased.

In the first preferred embodiment, since the anti-diffusion film 24 is located between the second electrode film and the first Ti film 25, the unnecessary diffusion of Ti from the first Ti film 25 to the second electrode film 22 is unlikely to occur. Therefore, Ti is able to be efficiently diffused from the first Ti film 25 to the first electrode film 26.

It is preferred that the first Ti film 25 is not positioned on one of both main surfaces of the first electrode film 26 that is far from the piezoelectric substrate 11 but is positioned on one close to the piezoelectric substrate 11. This is because the shift of frequency characteristics effectively proceeds due to the fact that Ti is diffused into the first electrode film 26 at a position close to the piezoelectric substrate 11.

In the first preferred embodiment, the IDT electrode 12 may include an adhesion film 21 or an anti-oxidation film 28 in addition to the first electrode film 26, the first Ti film 25, the anti-diffusion film 24, and the second electrode film 22 (refer to FIG. 3). The adhesion film 21 is located between the piezoelectric substrate 11 and the second electrode film 22. A material for forming the adhesion film 21 is, for example, an Ni—Cr alloy. The thickness of the adhesion film 21 is, for example, about 10 nm. The anti-oxidation film 28 is located above the second electrode film 22. A material for forming the anti-oxidation film 28 is, for example, an Al—Cu alloy containing about 1% by weight Cu. The thickness of the anti-oxidation film 28 is, for example, about 10 nm. The adhesion film 21 is formed on the piezoelectric substrate 11 and the anti-oxidation film 28 is formed above the piezoelectric substrate 11 preferably by the lift-off process.

In the first preferred embodiment, Ti is used to significantly reduce or prevent the interdiffusion between the first electrode film 26 and the second electrode film 22 and is also used to shift the frequency characteristic of the elastic wave device 10. Even if Cr is used instead of Ti, similar effects are able to be obtained. That is, a first Cr film that diffuses Cr as a diffusion material into the first electrode film 26 may be used instead of the first Ti film 25. Alternatively, an anti-diffusion film made of an oxide or nitride of Cr may be used instead of the first Ti film 25.

Second Preferred Embodiment

An elastic wave device 50 according to a second preferred embodiment of the present invention features the structure of an anti-diffusion film and a method for preparing the anti-diffusion film. The elastic wave device 50 has the same or substantially the same appearance as that of the elastic wave device 10 according to the first preferred embodiment and is not shown. Components common to the first preferred embodiment are given the same reference numerals and will not be described in detail.

Figure 5:
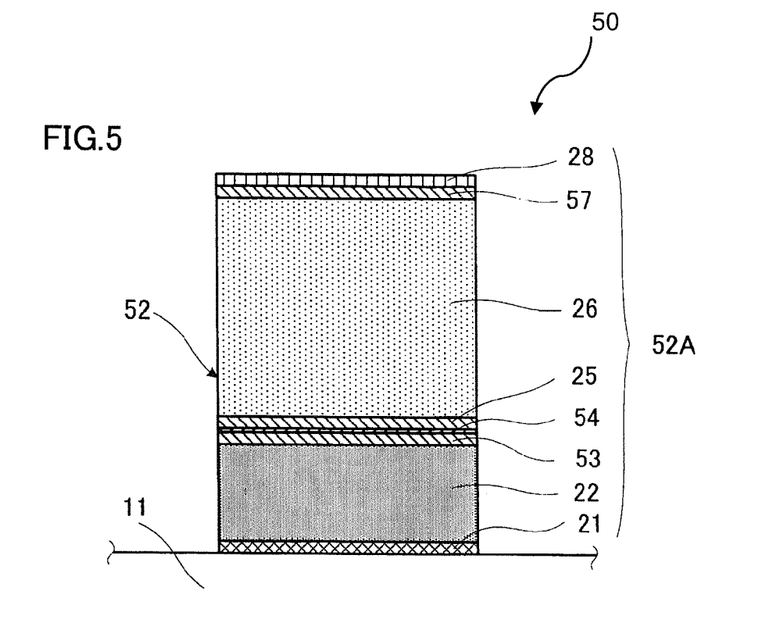
FIG. 5 is a sectional view of an electrode finger 52A of an IDT electrode 52 according to a second preferred embodiment of the present invention.

FIG. 5 is a sectional view of an electrode finger 52A of an IDT electrode 52 included in the elastic wave device 50 according to the second preferred embodiment. The IDT electrode 52 is a multilayer electrode including an anti-oxidation film 28, an auxiliary diffusion film 57, a first electrode film 26, a first Ti film (diffusion film) 25, an anti-diffusion film 54, a second Ti film 53, a second electrode film 22, and an adhesion film 21. The structure of the IDT electrode 52 and steps of preparing the IDT electrode 52 are described with reference to FIGS. 6A to 6C.

Figure 6A:
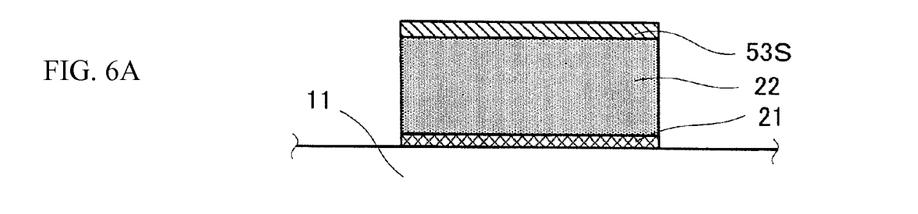
FIGS. 6A-6C are illustrations showing a method for preparing the IDT electrode 52 shown in FIG. 5.

First, as shown in FIG. 6A, the adhesion film 21, the second electrode film 22, and a single-layer Ti film 53S are provided on a piezoelectric substrate 11 in that order. These films are formed on the piezoelectric substrate 11 preferably by a thin film formation process. The single-layer Ti film 53S preferably is a single-layer film made of Ti only and has a thickness of, for example, about 5 nm to about 20 nm. The second electrode film 22 may be indirectly attached to the piezoelectric substrate 11 with the adhesion film 21 therebetween or may be directly attached to the piezoelectric substrate 11 without the adhesion film 21.

Figure 6B:
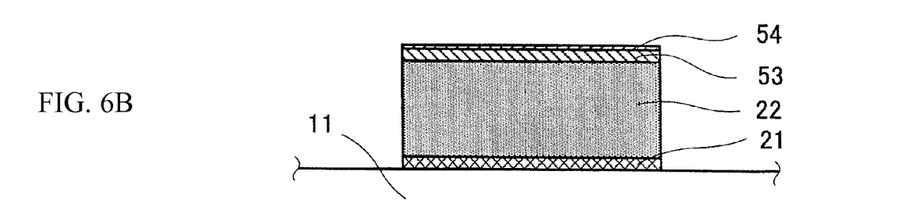

Next, as shown in FIG. 6B, a surface of the single-layer Ti film 53S is oxidized or nitrided, such that the anti-diffusion film 54 and the second Ti film 53 are provided. The anti-diffusion film 54 is an oxidized or nitrided surface region of the single-layer Ti film 53S and preferably has a thickness of, for example, about 0.5 nm to about 1 nm. The second Ti film 53 is an unoxidized or unnitrided region of the single-layer Ti film 53S and therefore is located between the anti-diffusion film 54 and the second electrode film 22. The second Ti film 53 preferably has a thickness of, for example, about 4 nm to about 19.5 nm.

Figure 6C:
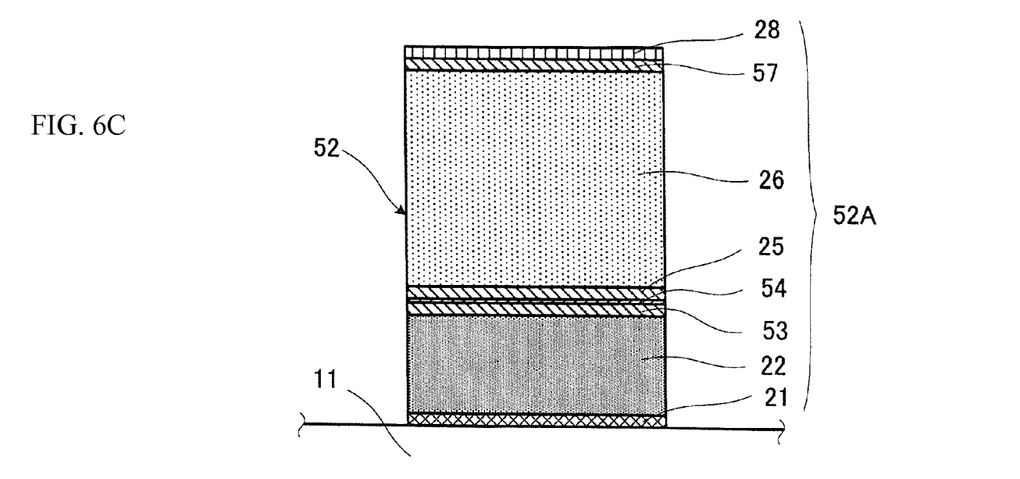

Next, as shown in FIG. 6C, the first Ti film 25, the first electrode film 26, the auxiliary diffusion film 57, and the anti-oxidation film 28 are provided on the anti-diffusion film 54 in that order. These films are also formed preferably by the thin film formation process. The auxiliary diffusion film 57 diffuses Ti into the first electrode film 26 from the side opposite to the first Ti film 25. A material for forming the auxiliary diffusion film 57 is, for example, Ti or Cr. The thickness of the auxiliary diffusion film 57 preferably is, for example, about 10 nm. Incidentally, the auxiliary diffusion film 57 and the anti-oxidation film 28 are not essential for the IDT electrode 52 and may be formed as required.

The IDT electrode 52 of the elastic wave device 50 is prepared through the steps shown in FIGS. 6A to 6C.

In the second preferred embodiment, the single-layer Ti film 53S, which is formed using Ti only, has a more uniform surface as compared to a film formed by directly depositing an oxide or nitride of Ti. Thus, the anti-diffusion film 54 preferably is uniformly formed on the surface side of the single-layer Ti film 53S by oxidizing or nitriding the surface of the single-layer Ti film 53S. This increases the adhesion between the anti-diffusion film 54 and the first Ti film 25, which is formed on the anti-diffusion film 54. The anti-diffusion film 54 can be more uniformly formed by naturally oxidizing or nitriding the single-layer Ti film 53S.

In the second preferred embodiment, the thickness of the first Ti film 25 is preferably larger than the thickness of the second Ti film 53. This is because in the case in which the IDT electrode 52 is formed so as to have the same thickness, the amount of Ti for diffusion that contributes to the diffusion of Ti is increased. This allows Ti to be actively diffused into the first electrode film 26.

In the second preferred embodiment, Ti is used to form the anti-diffusion film 54 and the second Ti film 53. Even if Cr is used instead of Ti, similar effects are able to be obtained. That is, an anti-diffusion film made of an oxide or nitride of Cr and a second Cr film may be formed using a single-layer Cr film instead of the single-layer Ti film 53S.

The elastic wave device 50 according to the second preferred embodiment has been subjected to an acceleration test relating to power durability life. As a result, the power durability life was 53 hours and was 10 times or more the power durability life of the comparative example described in the first preferred embodiment.

The above-mentioned preferred embodiments are not intended to limit the present invention specified in the claims. Various modifications can be made within a range where the identity of a technical idea is recognized. For example, the positional relationship between a first electrode film and a second electrode film with respect to a piezoelectric substrate may be reversed. Alternatively, a portion of an electrode finger may be embedded in a recessed portion in a piezoelectric substrate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
a piezoelectric substrate; and
an IDT electrode located on the piezoelectric substrate and including electrode fingers; wherein
the IDT electrode is a multilayer electrode including:
a first electrode film made of Al or an alloy mainly including Al;
a second electrode film with a density larger than that of the first electrode film;
an anti-diffusion film located between the first electrode film and the second electrode film and preventing interdiffusion between the first electrode film and the second electrode film; and
a diffusion film, located between the first electrode film and the anti-diffusion film, that diffuses a diffusion material into the first electrode film.

2. The elastic wave device according to claim 1, wherein the anti-diffusion film diffuses the diffusion material into the first electrode film, the anti-diffusion film is made of an oxide or a nitride of Ti and a first Ti film, and the diffusion material is made of Ti.

3. The elastic wave device according to claim 2, wherein the IDT electrode includes an unoxidized or unnitrided second Ti film located between the anti-diffusion film and the second electrode film, and a thickness of the first Ti film is larger than a thickness of the second Ti film.

4. The elastic wave device according to claim 3, wherein the anti-diffusion film includes a region in which a single-layer Ti film made of Ti only is located on the second electrode film and a surface of the single-layer Ti film is oxidized or nitrided and the second Ti film is an unoxidized or unnitrided region of the single-layer Ti film.

5. The elastic wave device according to claim 1, wherein the anti-diffusion film is made of an oxide or nitride of Cr and the diffusion film is a first Cr film that diffuses Cr as a diffusion material into the first electrode film.

6. The elastic wave device according to claim 5, wherein the IDT electrode includes an unoxidized or unnitrided second Cr film located between the anti-diffusion film and the second electrode film, and a thickness of the first Cr film is larger than a thickness of the second Cr film.

7. The elastic wave device according to claim 6, wherein the anti-diffusion film is a region in which a single-layer Cr film made of Cr only is located on the second electrode film and a surface of the single-layer Cr film is oxidized or nitrided and the second Cr film is an unoxidized or unnitrided region of the single-layer Cr film.

8. The elastic wave device according to claim 1, wherein the piezoelectric substrate and the IDT electrode define one of a surface acoustic wave filter, a surface acoustic wave resonator, and a boundary wave filter.

9. The elastic wave device according to claim 1, further comprising extended electrodes located on the piezoelectric substrate.

10. The elastic wave device according to claim 1, further comprising a support section with a frame shape located on the piezoelectric substrate surrounding the IDT electrode.

11. The elastic wave device according to claim 10, further comprising an insulating member located above the piezoelectric substrate and in contact with the support section that is located between the insulating member and the piezoelectric substrate.

12. The elastic wave device according to claim 11, further comprising a protective member located over the insulating member and the piezoelectric substrate.

13. The elastic wave device according to claim 12, further comprising via conductors extending through the support section, the insulating member and the protective member.

14. The elastic wave device according to claim 2, wherein a thickness of the first electrode film is larger than a thickness of the first Ti film, the anti-diffusion film, or the second electrode film.

15. The elastic wave device according to claim 2, wherein a thickness of the second electrode film is larger than a thickness of the first Ti film or the anti-diffusion film.

16. The elastic wave device according to claim 1, wherein the second electrode film is located closer to the piezoelectric substrate than the first electrode film.

17. The elastic wave device according to claim 1, further comprising an adhesion film located between the piezoelectric substrate and the second electrode film, or an anti-oxidation film located above the second electrode film.

18. A method for manufacturing the elastic wave device according to claim 4, comprising the steps of:
directly or indirectly attaching the second electrode film to the piezoelectric substrate;
providing the single-layer Ti film on the second electrode film;
forming the anti-diffusion film and the second Ti film from the single-layer Ti film by oxidizing or nitriding a surface of the single-layer Ti film;
providing the first Ti film on the anti-diffusion film; and
providing the first electrode film on the first Ti film.

19. A method for manufacturing the elastic wave device according to claim 7, comprising the steps of:
directly or indirectly attaching the second electrode film to the piezoelectric substrate;
providing the single-layer Cr film on the second electrode film;
forming the anti-diffusion film and the second Cr film from the single-layer Cr film by oxidizing or nitriding a surface of the single-layer Cr film;
providing the first Cr film on the anti-diffusion film; and
providing the first electrode film on the first Cr film.

* * * * *